United States Patent
Chong et al.

(10) Patent No.: US 6,534,390 B1
(45) Date of Patent: Mar. 18, 2003

(54) SALICIDE METHOD FOR PRODUCING A SEMICONDUCTOR DEVICE USING SILICON/AMORPHOUS SILICON/METAL STRUCTURE

(75) Inventors: Yung Fu Chong, Singapore (SG); Randall Cha, Singapore (SG); Kin Leong Pey, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/050,444

(22) Filed: Jan. 16, 2002

(51) Int. Cl.$^7$ .................. H01L 21/3205; H01L 21/4763
(52) U.S. Cl. ...................... 438/592; 438/595; 438/651; 438/652; 438/660; 438/663; 438/682; 438/692
(58) Field of Search ................... 438/592, 595, 438/651, 652, 660, 663, 682, 692; 257/382, 383, 384, 388, 412, 754

(56) References Cited

U.S. PATENT DOCUMENTS

| | | | |
|---|---|---|---|
| 5,940,693 A | 8/1999 | Maekawa | 438/166 |
| 5,998,272 A | 12/1999 | Ishida et al. | 438/305 |
| 6,060,392 A * | 5/2000 | Essaian et al. | 438/682 |
| 6,074,900 A | 6/2000 | Yamazaki et al. | 438/164 |
| 6,316,319 B1 * | 11/2001 | Ishida et al. | 438/299 |
| 6,376,885 B1 * | 4/2002 | Tseng | 257/382 |
| 2001/0038136 A1 * | 11/2001 | Abiko | 257/412 |

* cited by examiner

Primary Examiner—Olik Chaudhuri
Assistant Examiner—Hsien Ming Lee
(74) Attorney, Agent, or Firm—George O. Saile; Rosemary L. S. Pike; William J. Stoffel

(57) ABSTRACT

The present invention provides an improved semiconductor device of a Silicon/Amorphous Silicon/Metal Structure (SASM) and a method of making an improved semiconductor device by a salicide process by using an anneal to form a thick silicide film on shallow source/drain regions and a chemical-mechanical polish (CMP) step is then performed to remove the silicide over the top of the spacers at the gate, thus breaking the continuity of the silicide film extending from the gate to the source drain region.

26 Claims, 5 Drawing Sheets

SALICIDE METHOD FOR PRODUCING A SEMICONDUCTOR DEVICE USING SILICON/AMORPHOUS SILICON/METAL STRUCTURE

BACKGROUND OF THE INVENTION

1. Field of Invention

The present invention relates generally to semiconductor devices and to an improved method of making a semiconductor device. More particularly, the present invention relates to a method to form silicide utilizing a silicon/amorphous silicon/metal (SASM) structure, and laser annealing.

2. Description of Prior Art

Semiconductor devices are well known in the art. Conventional semiconductor structure often includes self-aligned suicides that are formed by Rapid Thermal Annealing (RTA) process. However, this process may result in suicides with poor uniformity, and has a tendency to consume source/drain junctions during silicidation as junction depths continue to decrease to less than 100 nm. In addition the process always has a silicide etch-back step after the first silicidation step to prevent bridging of the gate to the source/drain regions, which the current invention avoids.

For Example, U.S. Pat. No. 6,060,392 (Essaian et al.) discloses a laser anneal silicide process, however this process does not teach a key last CMP step of the current invention. U.S. Pat. No. 5,940,693 (Maekawa), U.S. Pat. No. 5,988,272 (Ishida et al.), and U.S. Pat. No. 6,074,900 (Yamazaki et al.), all show other laser anneal silicide processes.

SUMMARY OF THE INVENTION

Accordingly, the present invention provides an improved semiconductor device and method of making an improved semiconductor device using a SASM structure. Another purpose of the present invention is to use laser annealing for the formation of thick (low sheet resistance) silicide film on shallow source/drain regions. The extremely high ramp-up rate which is near zero thermal budget of the laser anneal allows melting and intermixing of the metal and silicon atoms. A Chemical Mechanical Polishing (CMP) step is used to break the continuity of the silicide film extending from the gate to Source/Drain regions instead of a silicide etch-back step.

The method of this invention includes the formation of a semiconductor device having a substrate and forming a gate dielectric layer over the substrate. A gate layer is formed over the gate dielectric layer, and then a cap layer is formed over that. After creating a lightly doped source/drain extension region in the substrate, spacers are formed on the side of the gate dielectric layer, gate layer, and cap layer, resulting in an intermediate structure. A deep source/drain region is then formed in the substrate. This is followed by an annealing step to activate dopants. The cap layer is then removed, and silicon film is deposited over the whole structure so far. A metal layer is then deposited over the silicon film. Using laser irradiation on the silicon film and the metal then creates a silicide. A pre-metal dielectric layer is then deposited and a chemical mechanical polishing is used to break the continuity of the silicide.

Semiconductor devices are well known in the art, and it is well known in the art that they can be either an N-MOS transistor or a P-MOS semiconductor.

The inventor has found the laser anneal process has advantages over conventional RTA and the advantages are: an extremely high heating and cooling rate; ability to form fine-grained suicides; and capability of heating only the top surface region. Another advantage, besides the laser process, is the SASM structure, which has the advantages of providing additional silicon for silicidation, thus forming thick silicide without junction consumption.

BRIEF DESCRIPTION OF THE DRAWINGS

In the accompanying drawings forming a material part of this description there is shown.

DETAILED DESCRIPTION OF THE INVENTION

Figure 1:
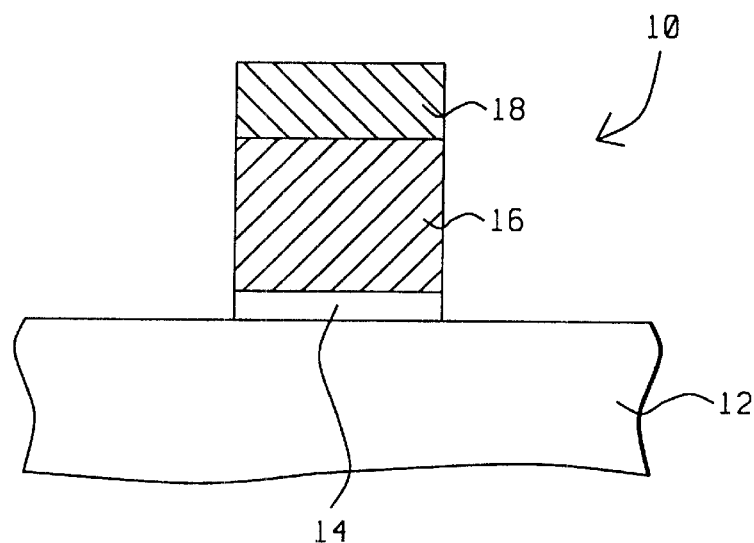
FIG. 1 shows a cross sectional view of a first step in the method of the current invention.

Referring now more particularly to FIG. 1, a basic structure 10 is a first step in a semiconductor device structure. Basic structure 10 has a substrate 12, with a gate dielectric layer 14 on the substrate 12. The gate dielectric layer 14 is preferably made of silicon oxynitride and has a thickness of 10 to 150 Angstroms but preferably 16 Angstroms. A gate layer 16 is formed on gate dielectric layer 14. The gate layer 16 is preferably doped poly-silicon and has a thickness of 500 to 3000 Angstroms but preferably 1600 Angstroms.

Cap layer 18 is formed on the gate layer 16. The cap layer 18 is preferably made of silicon nitride and has a thickness of 500 to 2000 Angstroms but preferably 1000 Angstroms. The gate and cap layers 16 and 18 are deposited and then patterned as is well known in the art.

Figure 2:
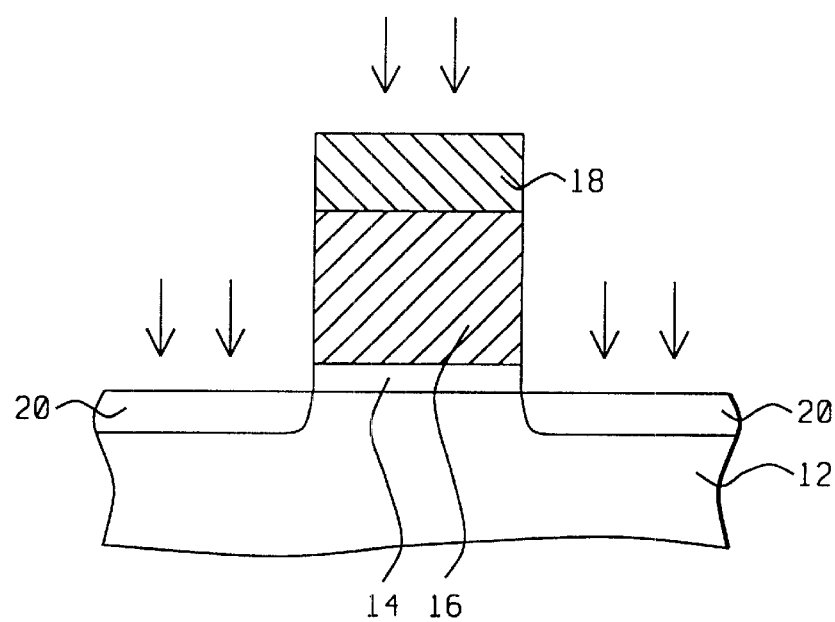
FIGS. 2–10 show cross-sectional views of a number of steps in the method of the current invention.
Figure 3:
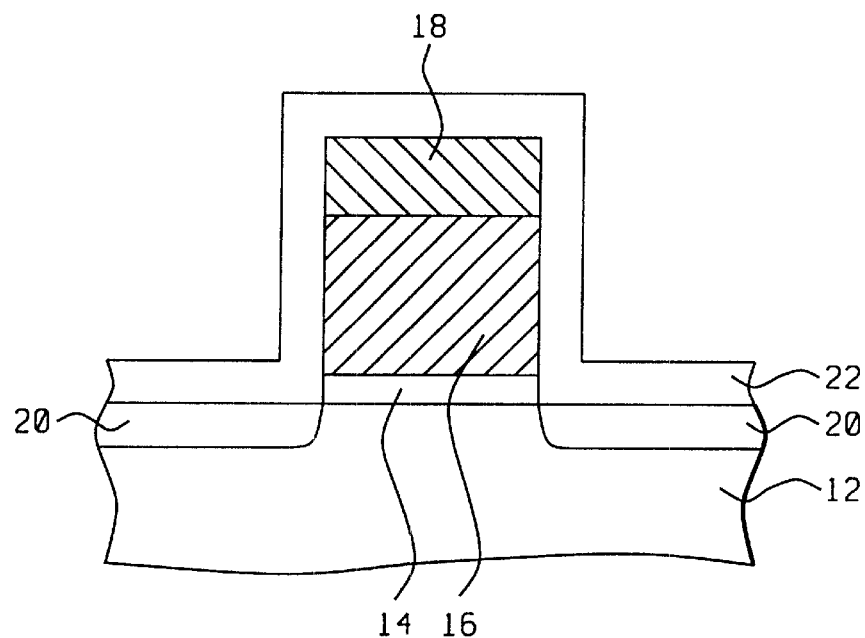

In FIG. 2 ion implantation is done to form the lightly doped source/drain extension 20. In FIG. 3 a spacer layer 22 is then deposited. The spacer layer 22 is preferably made of an oxide film and has a thickness of 300 to 1500 Angstroms but is preferable 800 Angstroms.

Figure 4:
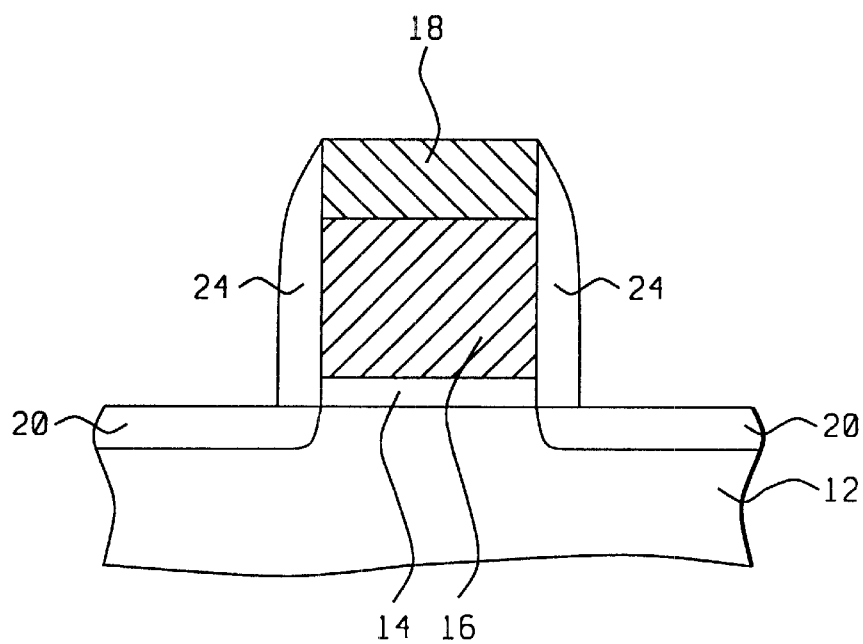

As shown in FIG. 4, an anisotropic etch is used to form spacers 24 from spacer layer 22. The preferred anisotropic etch used to form the spacers 24 is an oxide dry etch.

Figure 5:
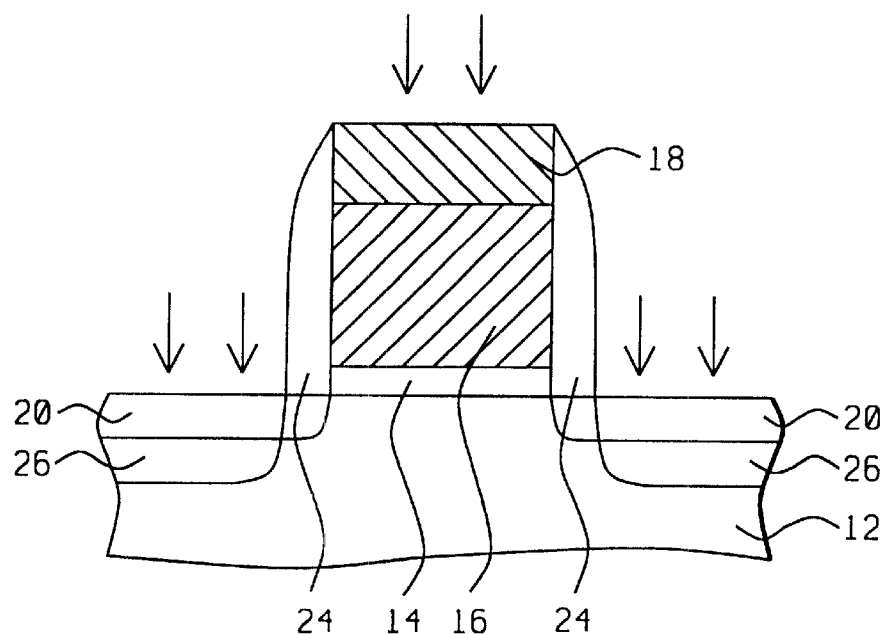
Figure 6:
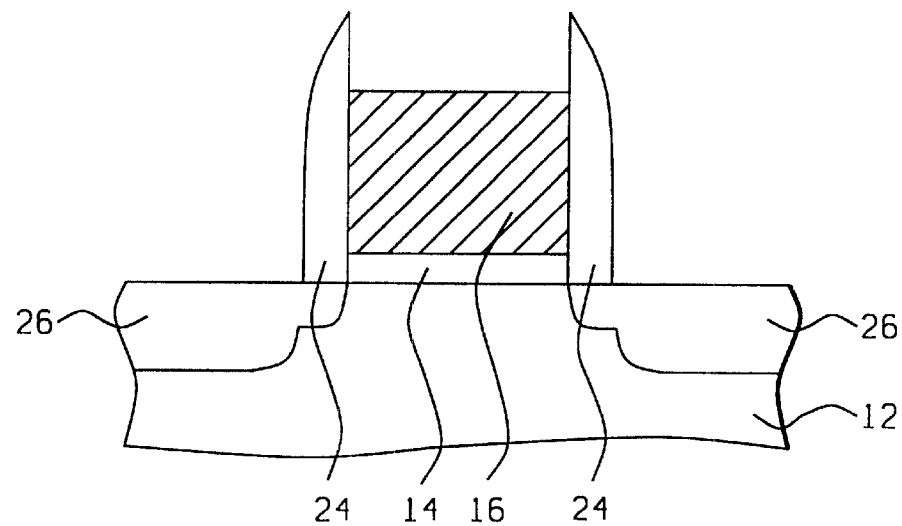

Then FIG. 5 shows ion implantation to form deep source/drain regions 26. This is followed by Rapid Thermal Annealing (RTA) to activate the dopants. Referring now to FIG. 6, a selective etching of the cap layer 18 is then done.

Figure 7:
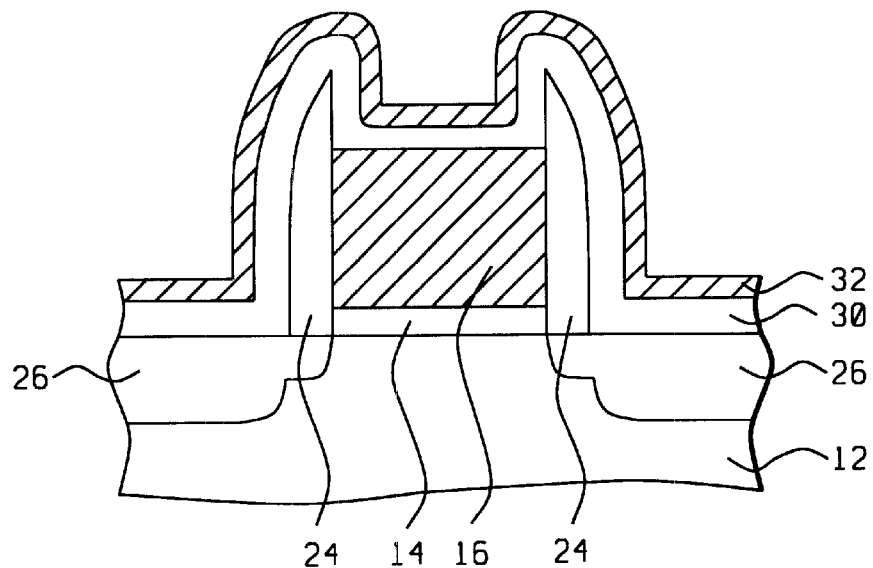

In FIG. 7, a blanket deposition of silicon film 30 is made. Preferably layer 30 is made of amorphous silicon but optionally the silicon can be poly silicon. Amorphous Silicon is deposited using low-pressure chemical vapor deposition (LPCVD) with silane (SiH4) as the reacting gas. Pyrolysis (thermal decomposition) of SiH4 causes the deposition of silicon. The temperature used is less than 580 degrees Centigrade. The deposited film is essentially amorphous. At higher temperatures 580 to 650 degrees Centigrade, polycrystalline silicon will be deposited instead. The silicon layer 30 has a thickness of 50 to 1000 Angstroms but is preferable 600 Angstroms.

The deposition of silicon layer 30 is followed by a metal deposition 32 over the silicon layer 30. Metal layer 32 is preferably made of titanium, cobalt, or nickel and has a thickness of 50 to 500 Angstroms but preferably 400 Angstroms. Hence, an intermediate SASM structure is formed. The metal layer 32 is typically deposited using physical vapor deposition (PVD), which includes sputtering and evaporation.

Figure 8:
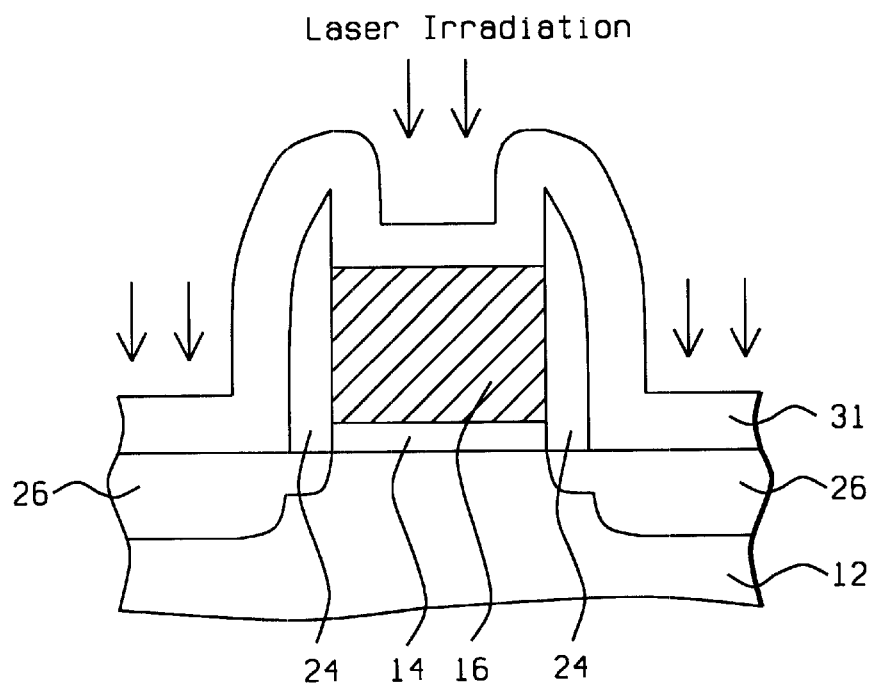

As shown in FIG. 8, in a key step, preferably laser irradiation is used to heat up metal layer 32 and silicon layer 30 to form silicide layer 31. Rapid Thermal annealing can also be used. The laser irradiation is preferably performed by pulsed laser irradiation of selected wavelengths and fluence. Fluence is the energy density of the irradiation.

Wavelength should be in the range of 157 nm to 308 nm. The preferred wavelength of laser irradiation is 248 nm. Fluence is in the range of 0.1 to 1.5 J/cm squared. Duration of annealing is proportional to the laser pulse duration, which is tens of nanoseconds. A pulsed laser can emit irradiation with a controllable number of pulses.

Since the melting temperature of amorphous silicon is lower than the melting temperatures of the metal and single crystal silicon, the amorphous silicon layer melts more easily. Stoichiometeric ratio between the metal and silicon layers 32 and 30 is such that the reaction between them and the source/drain regions 26 consumes a minimum amount of silicon from the source/drain regions 26. It should be noted that some reactions with the source/drain regions 26 are necessary in order to form a desirable silicide with low contact resistance. Depending on the laser fluence, metal 32 and/or a minute portion of the source/drain regions 26 may also melt during laser irradiation.

Optionally, after laser irradiation, the silicon body is then subjected to a heat treatment to convert the silicided region into a highly crystalline silicide with a desired resistivity value. The heat treatment can either be a RTA step or subsequent multiple laser pulses at lower fluence. For RTA, temperature range is 250 to 900 degrees C.; duration ranges from 5 seconds to 1 hour. For heat treatment using subsequent multiple laser pulses, fluence should be in the range of 0.05 to 0.5 J/cm squared, and number of pulses applied range from 1 to 100. This SASM structure does not limit the annealing technique to laser irradiation. In fact, conventional RTA can also be used to perform silicidation. Silicide layer 31 can be titanium silicide, cobalt silicide, or nickel silicide.

Figure 9:
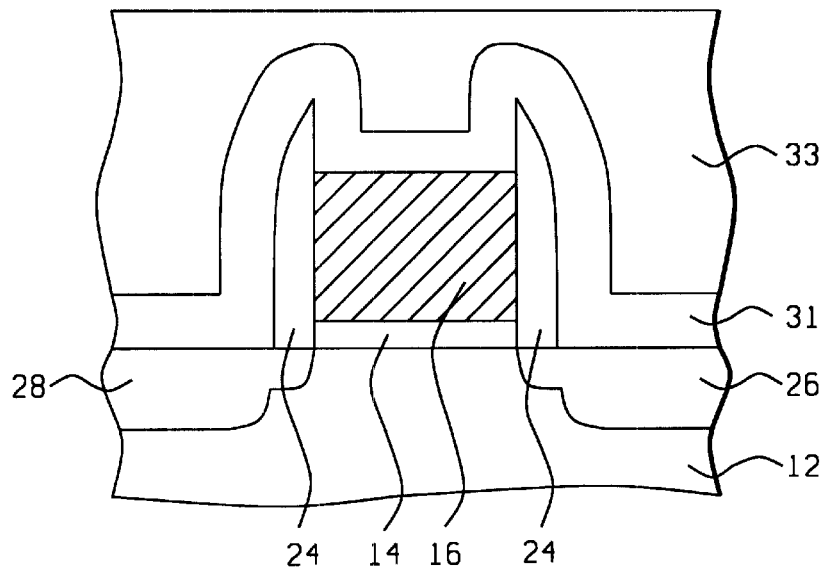
Figure 10:
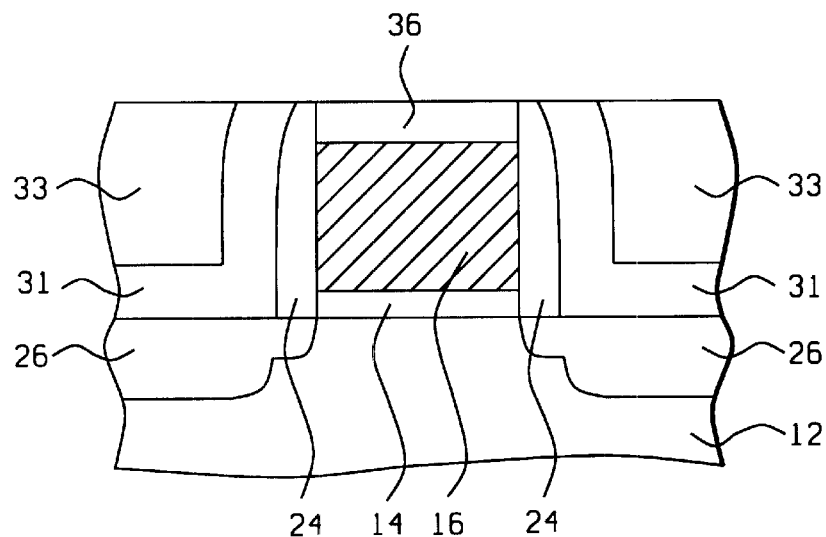

FIG. 9 shows a cross-sectional view of semiconductor device after deposition of an Interlevel Dielectric Layer (ILD) layer 33. ILD layer 33 is preferably made of oxide and has a thickness of 1000 to 5000 Angstroms, but preferable 3000 Angstroms. Finally FIG. 10 illustrates that a CMP is used to break the continuity of the silicide film extending from gate to the source/drain regions. Therefore, silicide layer 31 becomes source drain/silicide 34 and gate silicide 36. Therefore a silicide etch back step is not necessary.

After this, another interlevel dielectric layer (ILD) is formed over the gate silicide 36 and the source/drain silicide 34. Contact holes are formed in this ILD to expose the gate silicide 36 and the source/drain silicide 34. Next, conventional techniques can be used to form additional conductive and insulating layers there over to connect the semiconductor to other devices.

Unless explicitly stated otherwise, each numerical value and range should be interpreted as being approximate as if the word "about" or "approximately" preceded the value of the value or range.

While the invention has been particularly shown and described with reference to the preferred embodiments thereof, it will be understood by those skilled in the art that various changes in form, and details may be made without departing from the spirit and scope of the invention.

What is claimed is:

1. A method for forming semiconductor device comprising:

providing a substrate;

forming a gate dielectric layer over said substrate;

forming a gate layer over said gate dielectric layer;

forming a cap layer over said gate layer;

creating a lightly doped source/drain region in the substrate, and not under the gate dielectric layer;

forming spacers on the sidewalls of said gate dielectric layer, and said gate layer, and said cap layer to form an intermediate structure;

forming a deep source/drain region in said substrate and under said lightly doped source/drain region;

annealing to activate the dopants;

removing the cap layer;

depositing a silicon film over said intermediate structure;

depositing a metal layer over said silicon film;

forming a silicide layer from the silicon film and the metal layer by using laser irradiation;

subjecting the silicon body to a heat treatment to convert the silicide regions into low-resistivity silicides;

depositing an interlevel dielectric layer over said silicide layer;

chemical-mechanical polish (CMP) said interlevel dielectric layer, said spacers and said silicide to break the continuity of the silicide film to create a source/drain silicide film and a gate silicide film.

2. The method of claim 1, wherein the gate dielectric is made of silicon oxynitride having a thickness between 10 and 150 Å.

3. The method of claim 1, wherein the gate layer is made of doped poly silicon.

4. The method of claim 1, wherein the cap layer is nitride having a thickness between 500 and 2000 Å.

5. The method of claim 1, wherein the lightly doped source/drain area is formed by ion implantation.

6. The method of claim 1, wherein the spacer is made of an oxide film having a thickness in the range of 300 and 1500 Å.

7. The method of claim 1, wherein the spacers are made using anisotropic etch.

8. The method of claim 7, wherein the anisotropic etch used is an oxide dry etch.

9. The method of claim 1, wherein the deep source/drain region is formed by ion implantation.

10. The method of claim 1, wherein after creating the deep source/drain region, an annealing of the intermediate structure is done to activate dopants.

11. The method of claim 1, wherein the removing of the cap layer is done by selective etching.

12. The method of claim 1, wherein the silicon film is amorphous silicon.

13. The method of claim 12, wherein the amorphous silicon is deposited using low-pressure chemical vapor deposition (LPCVD) with silane (SiH4) as the reacting gas.

14. The method of claim 1, wherein the metal layer is one of the following:

a. titanium, b. cobalt, c. or nickel.

15. The method of claim 1, wherein the laser irradiation is from a pulsed excimer laser source.

16. The method of claim 1, wherein the laser irradiation is done at about 157 nm to 308 nm.

17. The method of claim 16, wherein the laser irradiation is done at 248 nm.

18. The method of claim 1, wherein the silicide layer is one of the following:

a. titanium silicide, b. cobalt silicide, c. or nickel silicid.

19. The method of claim 1, wherein the interlevel dielectric layer is an oxide.

20. The method of claim 1, wherein the silicide layer is formed from a Silicon/Amorphous Silicon/Metal structure.

21. The method of claim 1, wherein the metal layer is deposited using physical vapor deposition.

22. The method of claim 1, wherein the heat treatment can either be a RTA step or subsequent laser irradiation.

23. The method claim of claim 22 wherein the RTA step is in the temperature range from 250 to 900 degrees Centigrade, and has a duration in the range of 5 seconds to 1 hour.

24. The method claim of claim 22 wherein the heat treatment for using laser irradiation has a fluence is in the range of 0.05 to 0.5 J/cm squared, with the number of pulses applied ranging from 1 to 100".

25. A method for forming semiconductor device comprising:

providing a substrate;

forming a gate dielectric layer over said substrate;

forming a gate layer over said gate dielectric layer;

forming a cap layer over said gate layer;

forming spacers on the sidewalls of said gate dielectric layer, and said gate layer and said cap layer to form an intermediate structure;

creating a lightly doped source/drain region in the substrate, and not under the gate dielectric layer; and said cap layer to form an intermediate structure;

forming a deep source/drain region in said substrate and under said lightly doped source/drain region;

removing the cap layer;

depositing a silicon film over said intermediate structure;

depositing a metal layer over said silicon film;

forming a silicide layer from the silicon film and the metal layer by using rapid thermal annealing;

depositing an inter level dielectric layer over said silicide layer;

chemical-mechanical polish (CMP)said inter level dielectric layer, said spacers and said silicide to break the continuity of the silicide film to create a source/drain silicide film and a gate silicide film.

26. The Method of claim 25, wherein the rapid thermal annealing is at temperature range of about 250 to 900 degrees Centigrade; and duration ranges from 5 seconds to 1 hour.

* * * * *